United States Patent [19]

Stocker

[11] Patent Number: 4,484,979
[45] Date of Patent: Nov. 27, 1984

[54] TWO-STEP ANISOTROPIC ETCHING PROCESS FOR PATTERNING A LAYER WITHOUT PENETRATING THROUGH AN UNDERLYING THINNER LAYER

[75] Inventor: Hans J. Stocker, Summit, N.J.

[73] Assignee: AT&T Bell Laboratories, Murray Hill, N.J.

[21] Appl. No.: 600,524

[22] Filed: Apr. 16, 1984

[51] Int. Cl.[3] .................. B44C 1/22; C03C 15/00; C03C 25/06
[52] U.S. Cl. ............................ 156/643; 156/644; 156/646; 156/651; 156/653; 156/657; 156/659.1; 204/197 E; 252/79.1; 427/93
[58] Field of Search ........... 156/643, 646, 651, 652, 156/653, 657, 659.1, 662, 644, 648; 204/164, 192 E; 427/38, 39, 93, 94, 88; 29/571, 576 W; 252/79.1

[56] References Cited

U.S. PATENT DOCUMENTS 4,174,251 11/1979 Paschke ..................... 156/651 X
4,354,897 10/1982 Nakajima ................. 156/659.1 X

FOREIGN PATENT DOCUMENTS 56-87666 7/1981 Japan ......................... 156/643

OTHER PUBLICATIONS

IBM Technical Disclosure Bulletin, vol. 21, No. 4, Sep. 1978, Method of Removing Nitride Overhang Ledge by Differential Etch Technique, by S. U. Kim, pp. 1369–1370.

J. Jankuj, "Plasma Etching of Silicon and Its Compounds in the Freon Plasma", *Acta Phys. Slovaca*, vol. 29, No. 2, 1979, pp. 155–159.

M. Y. Tsai et al., "One-Micron Polycide (WSi$_2$ on Poly-Si) MOSFET Technology", *Journal of Electrochemical Society: Solid-State Science and Technology*, vol. 128, No. 10, Oct. 1981, pp. 2207–2214.

*Primary Examiner*—William A. Powell
*Attorney, Agent, or Firm*—David I. Caplan

[57] ABSTRACT

Patterning of a relatively thick silicon nitride layer coating a relatively thin silicon dioxide layer which coats a major surface of a silicon wafer is accomplished by reactive ion etching, without penetrating through the silicon dioxide layer to the major surface of the silicon wafer, by means of a two-step reactive ion etching procedure using a patterned masking layer. During the first etching step the silicon nitride layer is not completely penetrated; during the second step the nitride layer but not the silicon dioxide layer is completely penetrated. The gas mixture for the first etching step differs from that of the second etching step in accordance with prescription that the ratio of the etch rate of silicon dioxide to that of silicon nitride during the second step is significantly smaller than such ratio during the first step. Preferred gas mixtures are oxygen and CHF$_3$ in the ratio of about 0.6 to 1.0 for the first etching step and about 9 to 1 for the second etching step. Other systems of layers and wafers can be similarly patterned by means of two-step etching processes using selections of the gas mixtures in accordance with this prescription for the ratios of etch rates.

14 Claims, 4 Drawing Figures

TWO-STEP ANISOTROPIC ETCHING PROCESS FOR PATTERNING A LAYER WITHOUT PENETRATING THROUGH AN UNDERLYING THINNER LAYER

FIELD OF THE INVENTION

This invention relates to methods for patterning a layer and, more particularly, to methods for patterning a relatively thick first layer (e.g., silicon nitride) coating a relatively thin second layer (e.g., silicon dioxide) without anywhere penetrating all the way through the second layer, and thus without anywhere exposing the major surface of a wafer substrate (e.g., silicon) underlying the second layer.

BACKGROUND OF THE INVENTION

Patterning a relatively thick first layer, such as silicon nitride, which coats a relatively thin second layer, such as silicon dioxide, which in turn coats a major surface of a wafer substrate body, such as silicon, is useful in the art of semiconductor integrated circuit fabrication. For example, in the fabrication of integrated circuits comprising metal oxide semiconductor (MOS) transistors integrated in a silicon semiconductor wafer body, a silicon nitride layer which has been patterned with apertures is often used to define the gate and source and drain (GASAD) regions of the transistors to be fabricated. For this purpose, the apertures in the nitride layer must penetrate all the way down to the silicon dioxide layer, and in some applications the apertures should also penetrate a finite distance through the silicon dioxide layer. This nitride layer is deposited—typically either by low pressure chemical vapor deposition (LPCVD) or by plasma deposition—upon a layer of silicon dioxide located on a major surface of the silicon body. The silicon dioxide layer, called "pad oxide", ordinarily has a thickness which is much smaller than that of the silicon nitride layer, typically by a factor of at least about six. For example, the pad oxide layer is ordinarily less than about 400 Angstroms thick, typically about 125 to 175 Angstroms thick; whereas the nitride layer is typically about 1,200 Angstroms thick. To pattern the nitride layer with apertures, the nitride layer is first coated with a protective masking layer of etch resistant material—typically a photosensitive resist ("photoresist") material—and this masking layer is then patterned with apertures in accordance with the complement of the ultimately desired pattern of the transistor GASAD regions. A typical width w of the apertures is about 3 microns or less. The silicon nitride layer typically is then patterned with apertures by subjecting the nitride layer to a reactive ion etching plasma at a time when the nitride layer is coated with the thus patterned masking layer. Advantageously, the reactive ion etching of the silicon nitride layer is anisotropic; that is, the etching produces apertures that have essentially vertical sidewalls in the nitride layer. After the nitride layer has thus been patterned by means of the reactive ion etching process, the silicon body is subjected to a thermal growth treatment suitable for the growth of a relatively thick silicon dioxide layer—typically 9,000 Angstroms thick—in the regions where the nitride has been removed in the reactive ion etching step. This relatively thick silicon dioxide layer then serves as the "field oxide" layer. Note that the edges of this field oxide layer are contiguous with the edges of the transistor GASAD regions.

Because the pad oxide layer is much thinner than the silicon nitride layer, and because the conventional etching procedure removes oxide at a rate undesirably not sufficiently different from the rate it removes nitride, therefore, when etching the apertures in the nitride layer completely through to the pad oxide, it is very difficult to prevent the complete penetration of the relatively thin pad oxide. Consequently, during this conventional etching procedure, the top surface of the underlying silicon wafer is exposed to the etching plasma in regions underlying the apertures in the nitride layer, whereby the surface of the silicon wafer is undesirably etched thereat. This consequent etching of silicon can cause significant damage, and such damage can produce lattice defects (such as stacking faults) during subsequent thermal oxidation to grow the field oxide; in turn, these lattice defects can cause undesirable degradation in the performance of the integrated circuits that are subsequently fabricated. For instance, a degradation of the hold time of memory devices has been attributed to such stacking faults. On the other hand, it is necessary to etch at least some thickness of the pad oxide during the etching of the nitride in order to ensure that the entire thickness of the nitride layer underlying the apertures is removed, otherwise the subsequent thermal growth of field oxide would undesirably be impaired.

The reactive ion etching of the nitride is ordinarily performed in the etching chamber of an etching machine wherein a plurality of semiconductor wafers are simultaneously subjected to the etching process, a process having nonuniform etch rates, i.e., differing etching removal rates for different wafers, owing to the differing locations of the various wafers in the chamber of the etching machine. Although such nonuniformity of etch rates can be somewhat reduced by, for instance, elevating the ground plane in a conventional multifaceted etching chamber, commonly called a "Hex machine", nevertheless some nonuniformity undesirably persists. Thus, it is not feasible to adjust the length of time of the etching process so that the entire thicknesses of the nitride layers in all the wafers are removed at all regions underlying the apertures in the protective masks while ensuring at the same time that no underlying silicon in any wafer is also exposed and etched. Accordingly, it would be desirable to have an etching process which completely removes the nitride layer in regions underlying the apertures of the protective mask but at the same time which does not penetrate all the way through the silicon dioxide layer to expose the silicon.

On the other hand, reactive ion etchants which would desirably etch the silicon dioxide layer at a much slower rate than the silicon nitride layer, and hence would desirably avoid etching through the silicon dioxide layer, would also undesirably quickly etch the masking layer and hence could not be used without undesirably widening the apertures through most of, or even all of, the thickness of the nitride layer. Thus, linewidth control would be lost in using such an approach to prevent etching through the silicon dioxide layer. Yet such reactive ion etchants are otherwise desirable for etching through all of the silicon nitride layer without etching through all of the silicon dioxide layer. Moreover, even in the presence of unavoidable etching and consequent lateral erosion of the masking layer which may occur at a faster rate than the etching rate of either the first (silicon nitride) layer or the second (silicon dioxide) layer or both, it is important that any widening of the apertures in the nitride layer—i.e., any loss of linewidth control—should be kept relatively small in comparison with the width w of the apertures, that is, should be kept less than about 0.1 microns (1,000 Angstroms), a distance which typically is also less than the thickness of the nitride layer. Thus, the use of a masking layer which is etched faster than the nitride layer would seem to be precluded, and thus the choice of a suitable masking layer would seem to be extremely limited. Thus, it would be desirable to have a method for etching the apertures in the nitride layer using a masking layer that etches at a faster rate than the nitride layer. More generally, it is desirable to have a method for similarly patterning with apertures a relatively thick layer of material other than silicon nitride—such as polycrystalline silicon—whereby the apertures penetrate through this thick layer but not through an underlying relatively thin layer underlying this relatively thick layer.

SUMMARY OF THE INVENTION

This invention involves a method for forming a pattern of apertures in structure comprising a relatively thick first layer of a first material, such as silicon nitride, coating a relatively thin second layer of a second material (different from the first), such as silicon dioxide, which coats a major surface of a wafer body, such as silicon, comprising the steps of:

(a) coating the first layer with a masking layer which has apertures, each having a given original width, in accordance with the pattern;

(b) subjecting the structure to a first anisotropic etching step for a first amount of time whereby most (about 90 percent or more) but not all of the thickness of the first layer is removed from regions underlying at least some of the apertures in the masking layer, and all of the thickness thereof is removed from regions underlying any other apertures in the masking layer; and (c) subjecting the structure to a second anisotropic etching step for a second amount of time whereby the second layer is exposed in each region underlying each aperture, the ratio of the etching removal rate of the second material in the second layer to the etching removal rate of the first material in the first layer being significantly smaller during the second etching step than during the first etching step, the etching rate during the second step of the masking layer being greater than that of the first layer but during the first step being less than that of the first layer, whereby all of the thickness of the first layer underlying all of the apertures in the masking layer is removed but only a portion of the thickness of the second layer is anywhere removed.

In this way, the underlying major surface of the wafer remains everywhere coated by at least a remaining thickness of the second layer, and the width of the bottom of each aperture thus formed in the first layer is equal to the given original width w of the overlying aperture in the resist layer to within 0.1 micron.

It should be noted that during the second etching step the first layer, having been patterned during the first etching step, can advantageously serve as a protective mask, both for the remaining thickness of the first layer and for the second layer, during the second etching step, so that the second etching step (but not the first) can have the property of simultaneously etching the patterned resist layer by a substantial amount and nevertheless not cause significant linewidth loss in the first layer. (But then such a second etching step cannot be used for patterning the first layer without an undesirable amount of linewidth loss.) Thus, the first and second etching steps have different etching properties in this invention. Moreover, because of the ratio of the etching removal rate of the second to first layer is significantly smaller during the second etching step than during the first etching step, there are inherent safety margins in this inventive method to enable simultaneous similar etching of a pattern of apertures in many similar physically separate wafers, all located in the same etching chamber.

Note that although during the first step none of the second layer may be etched, nevertheless the etching rate that the second layer would have had if it had been etched during the first step is still relevant for the purpose of evaluating the merit of the two-step process in this invention, because the (potential) etching rate of the second layer under the etching conditions of the first step as opposed to the second step can be viewed as an indicator of the gain in control over the crucial etching of the second layer as a consequence of the two-step method of the invention.

In a specific embodiment of the invention, the first material is silicon nitride having a thickness of about 1,200 Angstroms, and the second material is silicon dioxide having a thickness in the range of about 125 to 175 Angstroms. The patterned resist layer has apertures with sidewalls which make an angle $\theta$ of less than 90 degrees with the interface of the nitride layer. The first anisotropic etching step is reactive ion etching with a mixture of over 50 percent by volume Freon 23 ($CHF_3$) and the rest oxygen ($O_2$), whereby the ratio of the etch rate of the silicon dioxide layer to the etch rate of the silicon nitride layer is about 0.4. The second anisotropic etching step is reactive ion etching with a mixture of about 10 percent (or less) $CHF_3$ and about 90 percent (or more) oxygen ($O_2$), whereby the ratio of the etch rate of the silicon dioxide layer to the etch rate of the silicon nitride layer during the second etching step is equal to or less than about 0.1, that is, equal to or less than about 0.25 (=0.1/0.4) of what it was during the first step. Thus, the etch rate of the silicon nitride layer is smaller during the second step as compared with the first step by a factor which is equal to or more than the ratio (about one-seventh) of the thickness of the second layer to the thickness of the first layer. It is important to note that etching with 100 percent oxygen would result in a negligible etching rate of both silicon dioxide and silicon nitride, and in a corresponding etching rate ratio of considerably more than 0.1. Thus, there is a particularly desirable gas mixture of $O_2$ and $CHF_3$ in the flow rate ratio of about 9 to 1. During the second etching step some of the resist is removed, but this resist removal does not affect the size of the aperture at the bottom of the nitride layer because the bottom portion of the nitride layer is not thereby affected due to the anisotropy of the etching, whereby the size of the aperture formed in the bottom portion of the nitride layer during the first etching step serves to delimit the size of the aperture formed at the interface of the silicon dioxide layer during the second etching step.

BRIEF DESCRIPTION OF THE DRAWING

This invention together with its features, characteristics, and advantages may be better understood from the following detailed description in which.

DETAILED DESCRIPTION

Figure 1:
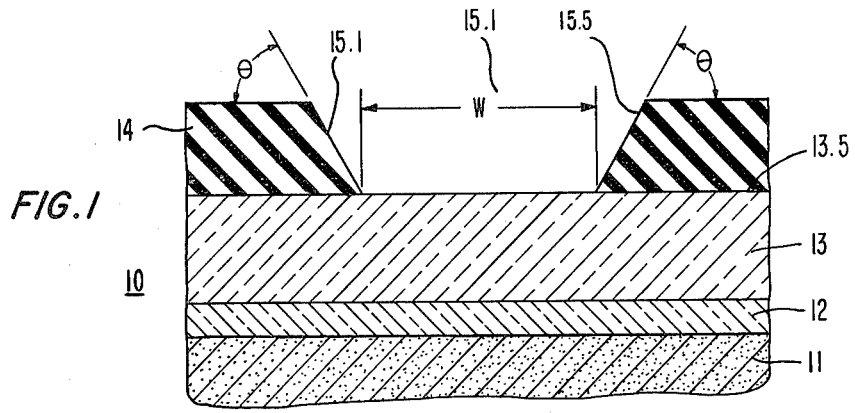
FIGS. 1-4 illustrate cross sections of a structure during successive stages of manufacture in accordance with a specific embodiment of the invention. Only for the sake of clarity, none of the Figures is drawn to any scale.
Figure 2:
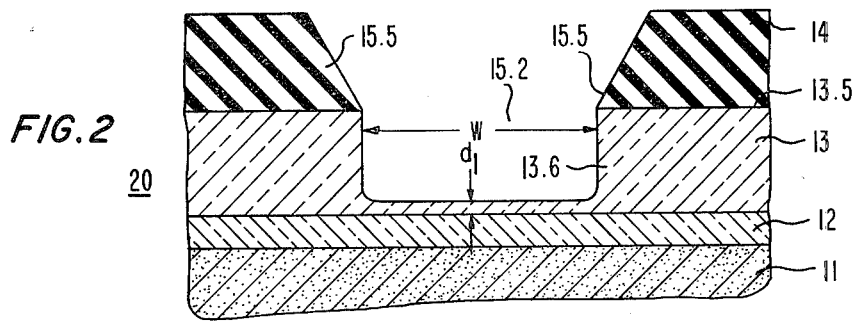

FIG. 1 shows a structure 10 including a silicon nitride layer 13 located upon and coating a silicon dioxide layer 12 in turn located upon and coating a silicon wafer 11. The silicon nitride layer is of substantially uniform material throughout its thickness and hence has a well-defined etching rate. The nitride layer 13 is coated with a conventional photoresist layer 14 which has been patterned with an aperture 15.1, whereby sidewalls 15.5 of the aperture have been formed by conventional photolithography. These sidewalls slope at an angle $\theta$—typically in the approximate range of 50 to 70 degrees, or even outside this range—with respect to the top horizontal surface 13.5 of the silicon nitride layer 13.

Typically, the silicon dioxide layer 12 is about 125 to 175 Angstroms thick; the silicon nitride layer 13 is about 1,200 Angstroms thick; and the photoresist layer is typically a layer of HPR204 and is about 12,000 Angstroms thick. The width w of the aperture 15.1 is illustratively about 2.5 microns, but it should be understood that the invention is applicable to almost any width from hundreds of microns down to about 0.4 micron or even less as the art progresses.

Although only a single aperture in a single structure is depicted in FIGS. 1-4, it should be understood that, because of the safety margins afforded by the invention, the etching steps described below can be carried out simultaneously upon many similar apertures, as well as upon many similar but physically separate structures all of which are located in a single etching chamber.

The structure 10 is placed in an etching chamber where it is subjected to a first anisotropic reactive ion etching (RIE) step using a first gaseous mixture with a flow rate of about 75 SCCM (Standard Cubic Centimeters per Minute, i.e., as measured at standard pressure and temperature). This first mixture is over 50 percent (typically about 70 percent) by volume $CHF_3$ (Freon 23), and the rest (typically about 30 percent) is $O_2$, at a total pressure of about 66 millitorr. Thus, the flow rate of $CHF_3$ to $O_2$ is greater than 0.5 (typically about 0.7). An accelerating voltage of about $-365$ to $-380$ volt dc, or RF power of 750 watts at a frequency of about 13.5 Hz, is useful for bringing the ions in the first mixture to kinetic energies suitable for reactive ion etching the silicon nitride layer 13. The etch rate of this nitride layer is thus about 550 Angstroms/minute, as compared with about 200 Angstroms/minute for the photoresist, and about 200 Angstroms/minute for the silicon dioxide layer. But the etching time of the first RIE step, about 2 minutes, is made short enough so that the entire thickness of the silicon nitride layer 13 is not etched, whereby a relatively small thickness $d_1$ of silicon nitride remains, typically about 50 Angstroms, and thus no silicon dioxide is exposed or hence actually etched during this first RIE step. Alternatively, one may continue to etch for a fraction of a minute longer, so that the entire thickness of nitride is thus removed in the majority of the apertures; the second etch step then ensures that all nitride is removed in any and all areas and wafers in the chamber without anywhere completely penetrating the silicon dioxide layer. Moreover, the original width w (FIG. 1) of the aperture in the photoresist is virtually the same as the width w (FIG. 2) of the resulting aperture 15.2 in the silicon nitride layer 13, owing to the relatively low etch rate of the photoresist layer 14 as compared with that of the nitride during this first RIE step. The resulting sidewalls 13.6 of the aperture in the nitride layer 13 are essentially vertical.

It should be noted that an approximate range of 45 percent to 85 percent $CHF_3$ with oxygen is useful for the first mixture. Alternatively, a mixture of typically about 55 percent $CHF_3$ with about 45 percent carbon dioxide ($CO_2$) can be used with almost identical results; and an approximate range of 40 percent $CHF_3$ to 70 percent $CHF_3$ with $CO_2$ is also useful. It is well known to workers in the art that additions of inert gases like $N_2$, He, Ar, Xe, etc., even in substantial quantities (up to 50 percent or more of the total gas composition), do not significantly change the etching characteristics of the plasma, and hence may be added. Also, relatively small (less than about 10 percent) additions of $H_2$, $CO_2$, $CF_4$, $C_2F_6$, and similar gases likewise will not significantly alter etch rates.

Figure 3:
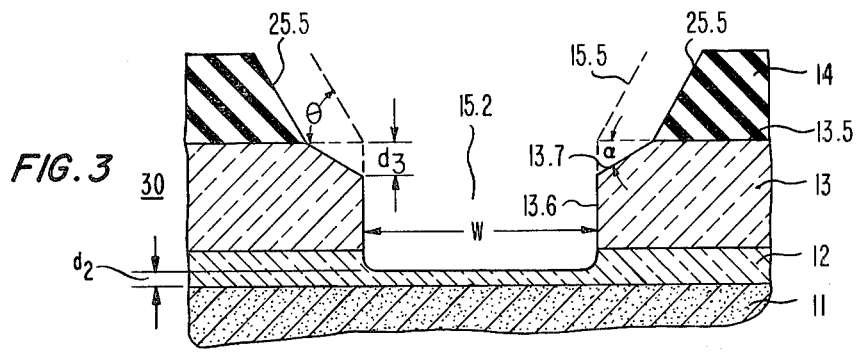
Figure 4:
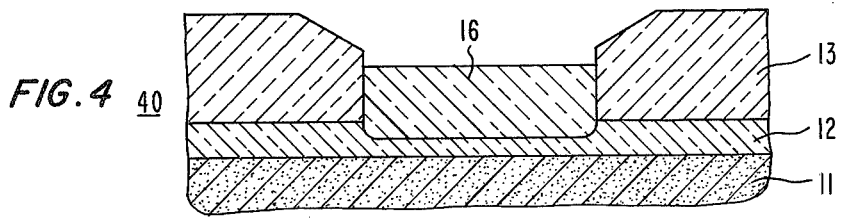

After the first etching step is performed as described above, the structure 20 (FIG. 2) is subjected to a second anisotropic reactive ion etching step with a second gas mixture. Advantageously, the second RIE step is performed in the same etching chamber that was used for the first RIE step. FIG. 3 illustrates the structure 30 resulting from the second etching step. The second mixture is typically at least about 90 percent oxygen and less than about 10 percent $CHF_3$ (flow rate ratio of oxygen to $CHF_3$ of at least about 9 to 1) at a total pressure of about 60 millitorr and flow rate of 100 SCCM, and an ion accelerating voltage (self-bias voltage) of about $-350$ to $-425$ volt, or an RF power of about 700 to 1,000 watts at a frequency of about 13.5 MHz. The nitride etch rate is thus about 300 Angstroms/minute, and the photoresist etch rate is about 1,500 Angstroms/minute—that is, about five times faster than that of the nitride layer. The duration of this second etching step is typically about 1.5 minutes, whereby the silicon dioxide layer 12 is exposed and partly etched at the bottom of the aperture in the nitride layer 13. Accordingly, a thickness of about 65 Angstroms of silicon dioxide layer is removed from the layer 12 by the second RIE step, and a thickness $d_2$ of at least about 60 Angstroms of silicon dioxide of this layer 12 remains after the second RIE step. At the same time, the photoresist layer 14 is considerably etched and eroded, and hence the resulting aperture 15.2 is considerably widened, whereby new sidewalls 25.5 in the photoresist are spaced farther apart but still slope at the same angle $\theta$. At the same time, the upper (and only the upper) portion of the sidewalls of the nitride layer 13 are also etched and hence widened. As a result, the angle $\alpha$ that the surface of new upper sidewalls 13.7 of the nitride layer 13 makes with the horizontal surface 13.5 is between about 9 and 20 degrees, typically about 16 degrees, while the thickness $d_3$ of the removed part of the nitride layer 13 is equal to about 200 Angstroms.

Thus (FIG. 3) the silicon nitride layer 13 has been patterned with apertures penetrating it completely, but at the same time none of the silicon body 11 is exposed, and hence the silicon is not damaged by any etching.

After removal of the photoresist layer 14, a standard thermal treatment of the structure 30 results in thermal growth from the silicon body 11 of a relatively thick silicon dioxide layer 16 (useful as field oxide) in the region of the aperture 15.2, but such thermal growth will not occur in the areas of the wafer where the nitride layer 13 remains intact. Finally, the nitride layer 13 can be removed, whereby there remains a structure 40 in which transistor GASAD regions are defined by the absence of the relatively thick (field oxide) layer 16.

It should be noted that an approximate range of 3 percent to 25 percent $CHF_3$, and the rest oxygen, is also useful for the second mixture, but that less than about 15 percent $CHF_3$ is preferred (etch rate ratio of silicon dioxide to silicon nitride less than 1/6). Alternatively, a mixture of typically at least about 80 percent $CO_2$ and less than about 20 percent $CHF_3$ (flow rate ratio of carbon dioxide to Freon 23 of at least about 8 to 2, or 4 to 1) can be used; and an approximate range of 5 percent to 30 percent $CHF_3$, and the rest $CO_2$, is also useful.

The temperatures of the wafers in the chamber during all ion etching steps range between about 20 degrees C. and 100 degrees C. depending upon the power supplied and the configuration of wafer holders and of the chamber.

Although the invention has been described in detail in terms of a specific embodiment, various modifications can be made without departing from the scope of the invention. For example, instead of $CHF_3$, other etching gases can be used such as $CF_4$ (Freon 14), $C_2F_6$ (Freon 16), or $C_3F_8$, at some sacrifice of etching speeds and of etching ratios of nitride to oxide layers. The two-step etching scheme of this invention may be used with other materials for the first and second layers where a relatively thick layer of a first material coating a relatively thin layer of a second material is to be patterned with apertures penetrating all the way through the first layer but not through the second layer, at the same time using a masking material which during the second etching step etches faster than the first layer, and using a first etching gas mixture during the first etching step that erodes the mask material at a relatively low rate consistent with the desired linewidth, and using a second etching gas mixture during the second etching step that can erode the mask material at a relatively high rate but which etches the second layer at a significantly slower rate than the first layer. For example, a relatively thick layer of silicon dioxide on a relatively thin layer of polycrystalline or monocrystalline silicon can be etched with the gas mixtures $CHF_3$ and oxygen with flow rate ratio of about 15 to 1 for the first etching step and of $CF_2Cl_2$ (Freon 12) and oxygen with the flow rate ratio of about 1 to 4 for the second etching step.

What is claimed is:

1. A method for forming a pattern of apertures in a structure comprising a relatively thick first layer of a first material coating a relatively thin second layer of a second material, different from the first, which coats a major surface of a wafer body including the steps of:
   (a) coating the first layer with a masking layer which has apertures, each having a given original width, in accordance with the pattern;
   (b) subjecting the structure to a first anisotropic etching step for a first amount of time, whereby most but not all of the thickness of the first layer underlying at least some of the apertures in the masking layer is removed, and all of the thickness thereof underlying any other apertures in the masking layer is removed;
   (c) subjecting the structure to a second anisotropic etching step for a second amount of time, the ratio of the etching removal rate of the second material in the second layer to that of the first layer being significantly smaller during the second etching step than during the first etching step, the etching rate during the second etching step of the masking layer being greater than that of the first layer but during the first step being less than that of the first layer, whereby all of the thickness of the first layer underlying all of the apertures in the masking layer is removed, but only a portion of the thickness of the second layer is anywhere removed, so that the underlying major surface of the wafer remains everywhere covered by at least a remaining thickness of the second layer.

2. The method of claim 1 in which the apertures in the masking layer have sidewalls which slope at an angle $\theta$ of about 60 degrees with respect to the interface of the first layer with the resist layer.

3. The method of claim 2 in which the first material is essentially silicon nitride, and the second material is silicon dioxide and in which the width of the bottom of each aperture thus formed in the first layer is equal to the given original width of the overlying aperture in the resist layer to within about 0.1 micron.

4. The method of claim 3 in which the wafer is essentially silicon.

5. The method of claim 4 further comprising after step (c) the step of thermally growing silicon dioxide in regions of the aperture, using the remaining portions of the silicon nitride layer as a patterned protective mask which suppresses the thermal growing.

6. The method of claim 1 in which the first and second etching steps are reactive ion etching with different first and second mixtures of gases, respectively.

7. The method of claim 1 in which the second etching step is simultaneously performed upon a plurality of wafer bodies, each coated with the first and second layers, all located in a single etching chamber.

8. The method of claim 7 in which the first etching step is simultaneously performed upon the plurality of wafer bodies all located in the single etching chamber.

9. The method of claim 1 in which the wafer body is essentially silicon.

10. A method of patterning a relatively thick silicon nitride layer which coats a relatively thin silicon dioxide layer comprising the steps of:
    (a) forming upon the silicon nitride layer a masking layer having apertures therein in accordance with the desired patterning of the silicon nitride layer;
    (b) subjecting the silicon nitride layer to a first anisotropic etching step for a first amount of time, whereby most but not all of the thickness of the silicon nitride layer in regions thereof underlying at least some of the apertures in the masking layer is removed;
    (c) subjecting the structure to a second anisotropic etching step for a second amount of time, whereby any remaining thickness of the silicon nitride layer is completely removed in regions underlying all the apertures, and whereby the silicon dioxide layer is thus exposed in such regions, the ratio of the etch rate of the silicon dioxide layer to the etch rate of the silicon nitride layer during the second etching step being less than such ratio during the first etching step, and the etch rate during the second etching step of the masking layer being greater than that of the nitride layer.

11. The method of claim 10 in which the second etching step is reactive ion etching with a gas mixture in which the flow rate ratio of oxygen to $CHF_3$ is at least about 9 to 1.

12. The method of claim 10 in which the gas mixture of the second etching step contains less than about 15 percent $CHF_3$ by volume.

13. The method of claim 10 in which the second etching step is reactive ion etching with a gas mixture in which the flow rate ratio of carbon dioxide to $CHF_3$ is at least about 4 to 1.

14. The method of claim 13 in which the gas mixture of the second etching step contains less than about 20 percent $CHF_3$ by volume.

* * * * *